United States Patent
Cassia (10) Patent No.: US 9,111,601 B2
(45) Date of Patent: Aug. 18, 2015

(54) NEGATIVE VOLTAGE GENERATORS

(71) Applicant: QUALCOMM Incorporated, San Diego, CA (US)

(72) Inventor: Marco Cassia, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/646,275

(22) Filed: Oct. 5, 2012

(65) Prior Publication Data

US 2013/0328597 A1 Dec. 12, 2013

Related U.S. Application Data

(60) Provisional application No. 61/657,307, filed on Jun. 8, 2012.

(51) Int. Cl.
*H02M 3/07* (2006.01)
*G11C 5/14* (2006.01)

(52) U.S. Cl.
CPC ............... *G11C 5/145* (2013.01); *G11C 5/147* (2013.01); *H02M 3/07* (2013.01); *H02M 2003/071* (2013.01); *H02M 2003/072* (2013.01); *H02M 2003/076* (2013.01)

(58) Field of Classification Search
CPC ... H02M 3/07; H02M 3/073; H02M 2003/07; H02M 2003/072; H02M 2003/076
See application file for complete search history.

(56) References Cited

U.S. PATENT DOCUMENTS

| | | | |
|---|---|---|---|
| 6,184,741 B1 | 2/2001 | Ghilardelli et al. | |
| 6,614,699 B2 | 9/2003 | Tanzawa | |
| 6,720,822 B2 * | 4/2004 | Torrisi et al. | 327/536 |
| 6,917,240 B2 | 7/2005 | Trafton et al. | |
| 6,970,035 B2 * | 11/2005 | Tanimoto | 327/536 |
| 7,005,912 B2 * | 2/2006 | Nonaka | 327/536 |
| 7,342,437 B2 * | 3/2008 | Onaya et al. | 327/536 |
| 7,528,647 B2 * | 5/2009 | Kawagoe | 327/536 |
| 7,583,131 B2 * | 9/2009 | Kimura et al. | 327/534 |
| 7,796,969 B2 * | 9/2010 | Kelly et al. | 455/333 |
| 7,843,255 B2 * | 11/2010 | Poles et al. | 327/540 |
| 7,990,741 B2 | 8/2011 | Martinussen | |
| 8,106,703 B2 * | 1/2012 | Nagai et al. | 327/536 |
| 8,625,366 B2 * | 1/2014 | Lee | 365/189.09 |
| 2003/0058030 A1 * | 3/2003 | Myono | 327/536 |
| 2007/0103225 A1 * | 5/2007 | Tanimoto | 327/536 |

(Continued)

OTHER PUBLICATIONS

International Search Report and Written Opinion—PCT/US2013/044810—ISA/EPO—Nov. 5, 2013.

*Primary Examiner* — Thomas J Hiltunen
(74) *Attorney, Agent, or Firm* — Ramin Mobarhan (57) ABSTRACT

Negative voltage generators that do not require level shifters or AC coupling capacitors are disclosed. In an exemplary design, a negative voltage generator includes first, second, third and fourth switches, a capacitor, and a control circuit. The first switch is coupled between an input node and a first node. The second switch is coupled between the first node and circuit ground. The third switch is coupled between a second node and circuit ground. The fourth switch is coupled between the second node and an output node. The input node receives a positive voltage, and the output node provides a negative voltage. The capacitor is coupled between the first and second nodes. The control circuit (e.g., an inverter) generates a control signal having positive and negative voltage levels for the third switch using a negative voltage level at the second node.

20 Claims, 8 Drawing Sheets

(56) References Cited

U.S. PATENT DOCUMENTS

| | | | |
|---|---|---|---|
| 2008/0122505 A1* | 5/2008 | Wu | 327/157 |
| 2008/0303586 A1 | 12/2008 | Li | |
| 2010/0301927 A1* | 12/2010 | Nagai et al. | 327/543 |
| 2010/0327959 A1* | 12/2010 | Lee | 327/536 |
| 2011/0018619 A1 | 1/2011 | Cassia | |
| 2011/0133821 A1* | 6/2011 | Honda | 327/536 |
| 2012/0153986 A1* | 6/2012 | Kim | 326/16 |
| 2012/0155208 A1 | 6/2012 | Lee | |
| 2012/0169406 A1* | 7/2012 | Liu | 327/536 |
| 2014/0022006 A1* | 1/2014 | Lin et al. | 327/536 |
| 2014/0253180 A1* | 9/2014 | Wang et al. | 327/109 |

* cited by examiner

NEGATIVE VOLTAGE GENERATORS

CLAIM OF PRIORITY UNDER 35 U.S.C. §119

The present Application for Patent claims priority to Provisional Application No. 61/657,307, entitled "Negative voltage generator" filed Jun. 8, 2012, and assigned to the assignee hereof and hereby expressly incorporated by reference herein.

BACKGROUND

I. Field

The present disclosure relates generally to electronics, and more specifically to negative voltage generators.

II. Background

An electronics device (e.g., a cellular phone) may include a voltage generator that receives a first voltage and generates a second voltage that is different from the first voltage. For example, the voltage generator may be a negative voltage generator that receives a positive voltage and generates a negative voltage. The negative voltage generator may be implemented with switches that can be controlled to charge and discharge capacitors in order to obtain the negative voltage. Some of the switches may observe positive voltage levels while other switches may observe negative voltage levels. Generating control signals for these switches in an efficient manner is challenging.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Negative voltage generators that do not require level shifters or AC coupling capacitors and which can be efficiently implemented on an integrated circuit (IC) are disclosed herein. These negative voltage generators may have various advantages such as reduced power dissipation, lower cost, smaller circuit area, faster operating speed, etc. The negative voltage generators may be used for various applications such as for controlling switches, for powering logic circuits requiring negative supply voltages, etc.

Figure 1A:
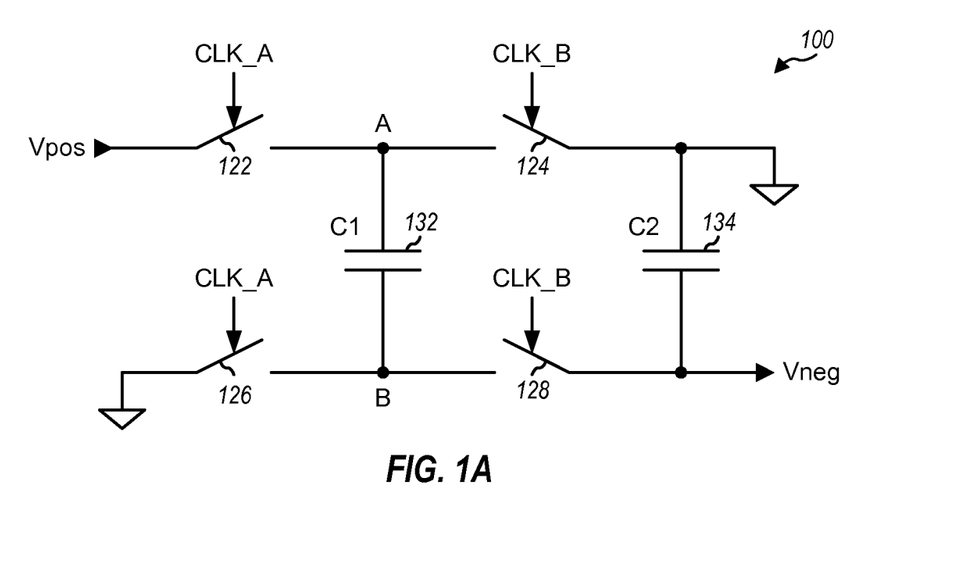
FIG. 1A shows a switched-capacitor negative voltage generator.

FIG. 1A shows a schematic diagram of a negative voltage generator 100 implemented with a switched-capacitor circuit. Within generator 100, a switch 122 is coupled between an input of generator 100 and node A. A switch 124 is coupled between node A and circuit ground. A capacitor 132 with a capacitance of C1 is coupled between node A and node B. A switch 126 is coupled between node B and circuit ground. A switch 128 is coupled between node B and an output of generator 100. Switches 122 and 126 are controlled by a CLK_A control signal, and switches 124 and 128 are controlled by a CLK_B control signal. A capacitor 134 with a capacitance of C2 is coupled between the output of generator 100 and circuit ground. A positive voltage (Vpos) is provided to the input of generator 100, and a negative output voltage (Vneg) is provided by the output of generator 100.

Figure 1B:
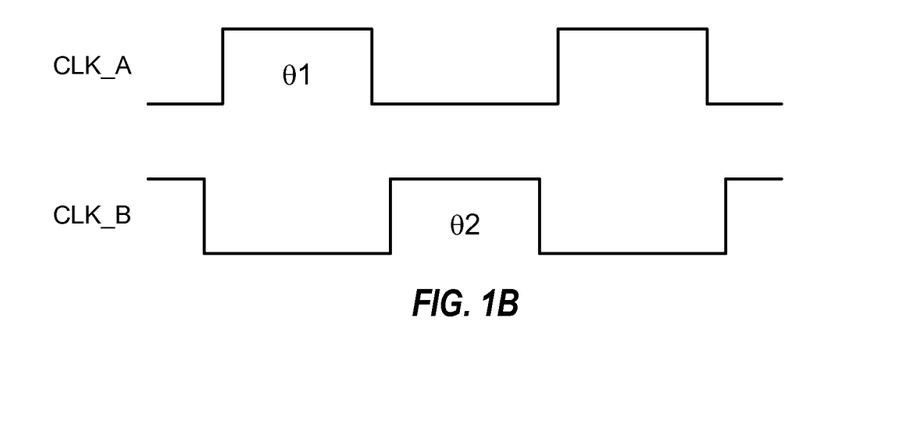
FIG. 1B shows control signals for the negative voltage generator in FIG. 1A.

FIG. 1B shows a timing diagram of the control signals for negative voltage generator 100 in FIG. 1A. The CLK_A signal is at logic high during a first phase θ1 of a clock signal and is at logic low for the remaining time. The CLK_B signal is at logic high during a second phase θ2 of a clock signal and is at logic low for the remaining time. The first phase is non-overlapping with the second phase, as shown in FIG. 1B.

Referring back to FIG. 1A, negative voltage generator 100 operates as follows. During the first phase θ1, the CLK_A signal is at logic high, the CLK_B signal is at logic low, switches 122 and 126 are closed, and switches 124 and 128 are opened. Capacitor 132 has its bottom plate connected to circuit ground via switch 126, and the Vpos voltage charges capacitor 132 to Vpos. During the second phase θ2, the CLK_A signal is at logic low, the CLK_B signal is at logic high, switches 122 and 126 are opened, and switches 124 and 128 are closed. Capacitor 132 has its top plate connected to circuit ground via switch 124 and provides a negative voltage of Vneg, which should be approximately −Vpos.

Negative voltage generator 100 generates a negative voltage by (i) charging capacitor 132 with the positive voltage during the first phase with the bottom plate of capacitor 132 connected to circuit ground and (ii) discharging capacitor 132 during the second phase with the top plate of capacitor 132 connected to circuit ground. Capacitor 134 stores charges from capacitor 132 during the second phase and provides the Vneg voltage during the first phase when capacitor 132 is being charged.

Negative voltage generator 100 may be implemented in various manners. For example, switches 122 to 128 may be implemented with transistors or some other electronics switches. Appropriate control signals may be provided to the switches to turn these switches on or off at the appropriate time.

Figure 2A:
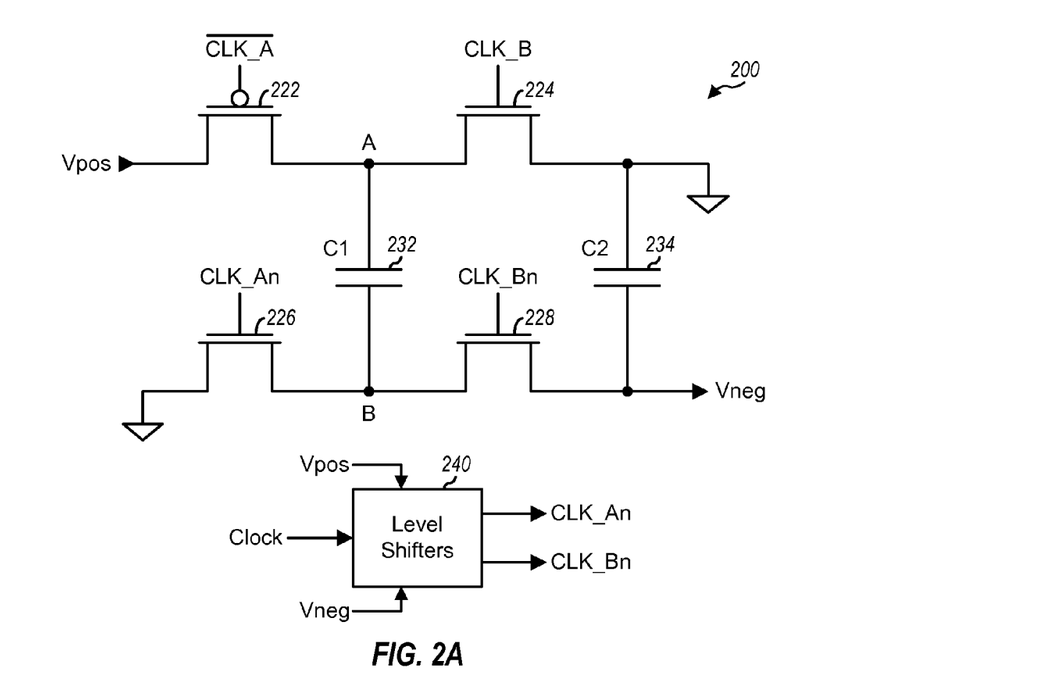
FIG. 2A shows a negative voltage generator implemented with metal oxide semiconductor (MOS) transistors.

FIG. 2A shows a schematic diagram of a negative voltage generator 200 comprising switches implemented with metal oxide semiconductor (MOS) transistors. Within generator 200, a P-channel MOS (PMOS) transistor 222 has one source/drain terminal coupled to an input of generator 200, the other source/drain terminal coupled to node A, and a gate receiving a $\overline{\text{CLK\_A}}$ control signal. An N-channel MOS (NMOS) transistor 224 has one source/drain terminal coupled to node A, the other source/drain terminal coupled to circuit ground, and a gate receiving a CLK_B control signal. Each MOS transistor may be implemented with a symmetric structure, and the source and drain of each MOS transistor may be interchangeable. A capacitor 232 is coupled between node A and node B. An NMOS transistor 226 has one source/drain terminal coupled to circuit ground, the other source/drain terminal coupled to node B, and a gate receiving a CLK_An control signal. An NMOS transistor 228 has one source/drain terminal coupled to node B, the other source/drain terminal coupled to the output of generator 200, and a gate receiving a CLK_Bn control signal. A capacitor 234 is coupled between the output of generator 200 and circuit ground. Generator 200 receives a positive voltage (Vpos) at its input and provides a negative voltage (Vneg) at its output.

Figure 2B:
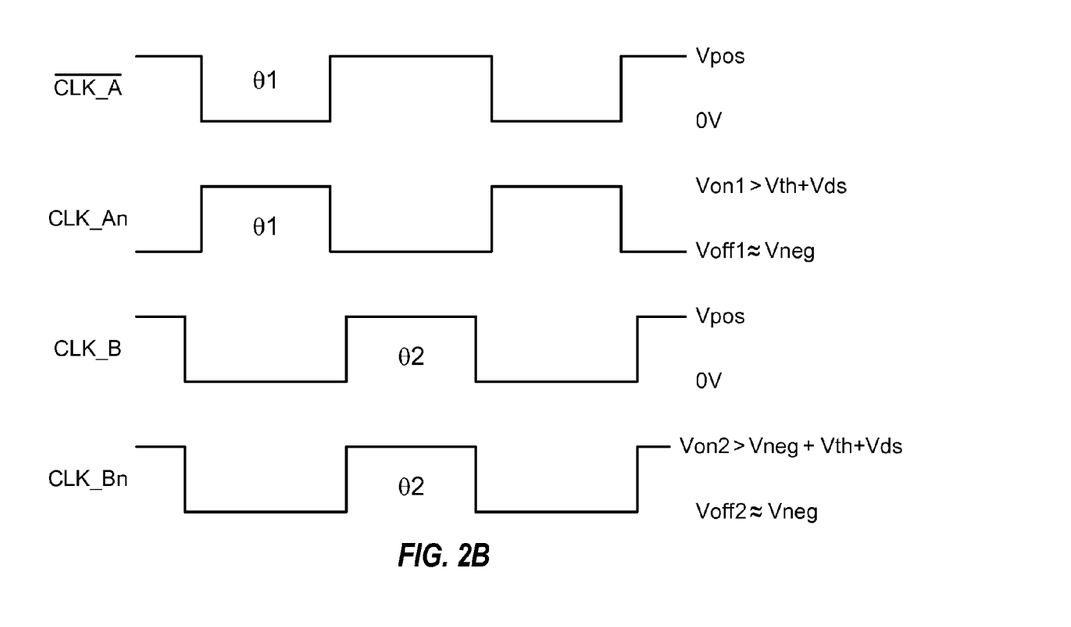
FIG. 2B shows control signals for the negative voltage generator in FIG. 2A.

FIG. 2B shows a timing diagram of the control signals for negative voltage generator 200 in FIG. 2A. The $\overline{CLK\_A}$ signal is at logic low and the CLK_An signal is at logic high during a first phase θ1 of a clock signal, and these control signals are at the opposite logic for the remaining time. The CLK_B and CLK_Bn signals are at logic high during a second phase θ2 of a clock signal and are at logic low for the remaining time. The first phase is non-overlapping with the second phase, as shown in FIG. 2B.

FIG. 2B also shows the voltage levels of the $\overline{CLK\_A}$, CLK_An, CLK_B and CLK_Bn signals. The $\overline{CLK\_A}$ and CLK_B signals may be standard digital signals and may have a voltage level of Vpos or Vdd for logic high and a voltage level of 0 Volts (V) for logic low, where Vdd is a power supply voltage. The CLK_An signal may have (i) a voltage level greater than Vth+Vds for logic high to turn on NMOS transistor 226 and (ii) a voltage level of approximately Vneg for logic low to turn off NMOS transistor 226, where Vth is a threshold voltage and Vds is a drain-to-source voltage of NMOS transistor 226. Vth is typically dependent on IC fabrication process and may be approximately 0.5V to 0.7V. Vds may be approximately 0V when an NMOS transistor is turned on and may be greater than 0V when switching between on and off states. The CLK_Bn signal may have (i) a voltage level greater than Vneg+Vth+Vds for logic high to turn on NMOS transistor 228 and (ii) a voltage level of approximately Vneg for logic low to turn off NMOS transistor 228.

Referring back to FIG. 2A, the source and drain of PMOS transistor 222 and the source and drain of NMOS transistor 224 observe either Vpos or 0V. Hence, the $\overline{CLK\_A}$ and CLK_B signals for PMOS transistor 222 and NMOS transistor 224 can have voltage levels of Vpos and 0V. NMOS transistor 226 observes 0V at node B when it is turned on during the first phase and observes Vneg at node B when it is turned off during the second phase. Hence, the CLK_An signal for NMOS transistor 226 should be greater than Vth during the first phase to turn on NMOS transistor 226 and should be approximately Vneg during the second phase to turn off NMOS transistor 226. NMOS transistor 228 observes 0V at node B when it is turned off during the first phase and observes Vneg at node B when it is turned on during the second phase. Hence, the CLK_Bn signal for NMOS transistor 228 should be greater than Vneg+Vth during the second phase to turn on NMOS transistor 228 and should be approximately Vneg during the first phase to turn off NMOS transistor 228.

Level shifters 240 may receive a clock signal, the Vpos voltage, and the Vneg voltage and may generate the CLK_An and CLK_Bn signals having the proper voltage levels in order to turn on and off NMOS transistors 226 and 228. A level shifter is a circuit that (i) receives a first supply voltage (e.g., Vpos) and a second supply voltage (e.g., Vneg), (ii) receives an input signal having a first voltage range (e.g., from 0V to Vpos), and (iii) provides an output signal having a second voltage range (e.g., from 0V to Vneg or from Vpos to Vneg). Level shifters 240 utilize the Vneg voltage provided by generator 200 to generate the CLK_An and CLK_Bn signals.

The use of level shifters to generate control signals for a negative voltage generator may be undesirable for several reasons. First, the use of Vneg by the level shifters would result in the level shifters consuming some of the output current provided by the negative voltage generator, which may adversely impact the performance of the negative voltage generator. The performance degradation may be more severe if the negative voltage generator is implemented on an IC chip and has a limited amount of integrated capacitance and hence limited current capability. The current consumed by the level shifters during switching may reduce the efficiency of the negative voltage generator, raise the average output voltage provided by the negative voltage generator, and cause spurs in the Vneg voltage, all of which may be undesirable.

Second, the level shifters introduce delays that may result in the control signals being misaligned. The level shifters generate non-overlapping CLK_An and CLK_Bn signals that should be time aligned with the $\overline{CLK\_A}$ and CLK_B signals, as shown in FIG. 2B. The level shifters typically have some delay and may need to be implemented with a complicated circuit design in order to account for the delay in generating the CLK_An and CLK_Bn signals. The clock rate of the negative voltage generator may also be limited by the speed of the level shifters. There may be other undesirable effects associated with the use of level shifters to generate control signals for a negative voltage generator.

In an aspect of the present disclosure, a negative voltage generator may generate a negative voltage without using level shifters. The digital control signals may have nominal voltage levels (e.g., 0V and Vpos) and may be used to drive switches and other control circuits. The negative voltage generator may avoid the disadvantages described above for a conventional negative voltage generator using level shifters.

Figure 3:
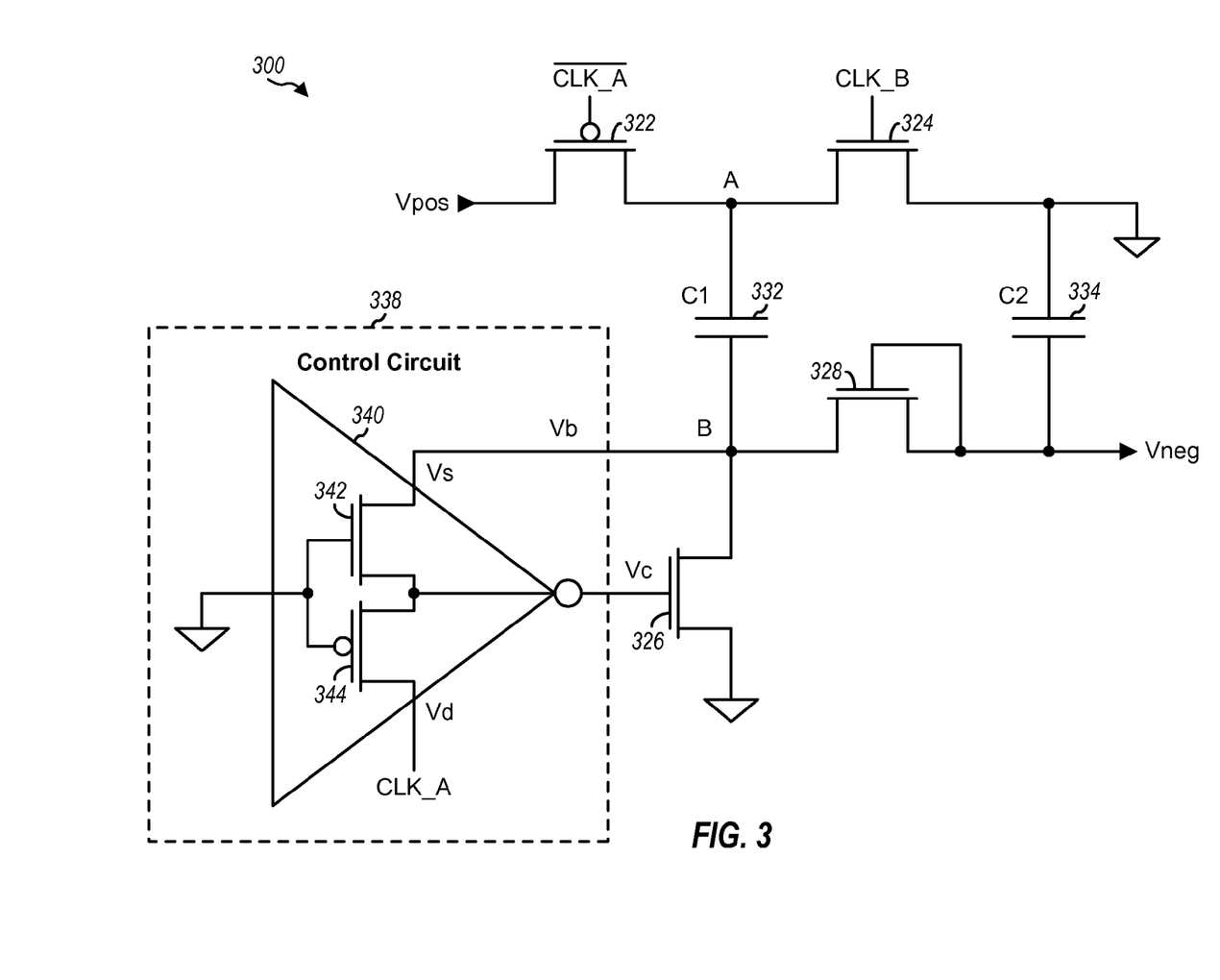
FIG. 3 shows a negative voltage generator with control signals generated without using level shifters.

FIG. 3 shows a schematic diagram of an exemplary design of a negative voltage generator 300 with no level shifters. Within generator 300, a PMOS transistor 322 has one source/drain terminal coupled to an input of generator 300, the other source/drain terminal coupled to node A, and a gate receiving a $\overline{CLK\_A}$ control signal. An NMOS transistor 324 has one source/drain terminal coupled to node A, the other source/drain terminal coupled to circuit ground, and a gate receiving a CLK_B control signal. A capacitor 332 is coupled between node A and node B. An NMOS transistor 326 has one source/drain terminal coupled to circuit ground, the other source/drain terminal coupled to node B, and a gate coupled to an output of a control circuit 338. An NMOS transistor 328 has one source/drain terminal coupled to node B and the other source/drain terminal and a gate coupled to the output of generator 300. NMOS transistor 328 is diode-connected and has its gate coupled to one source/drain terminal. Diode-connected NMOS transistor 328 may be considered as a series switch that can be turned on or off automatically without a control signal, as described below. A capacitor 334 is coupled between the output of generator 300 and circuit ground. Generator 300 receives a positive voltage (Vpos) at its input and provides a negative voltage (Vneg) at its output.

In the exemplary design shown in FIG. 3, control circuit 338 comprises an inverter 340 implemented with an NMOS transistor 342 and a PMOS transistor 344. MOS transistors 342 and 344 have (i) their gates coupled together and to an input of inverter 340 and (ii) their drains coupled together and to an output of inverter 340. NMOS transistor 342 has its source coupled to a lower supply pin (Vs) of inverter 340. PMOS transistor 344 has its source coupled to an upper supply pin (Vd) of inverter 340. A conventional inverter has its input receiving an input signal, its output providing an output signal, its Vd pin coupled to the Vdd supply, and its Vs pin coupled to circuit ground. Inverter 340 is coupled and operated differently than a conventional inverter. Inverter 340 has its input coupled to circuit ground, its output providing a Vc control signal to NMOS transistor 326, its Vd pin receiving a CLK_A control signal, and its Vs pin coupled to node B. NMOS transistor 326 and control circuit 338 may be considered as a shunt switch that can be controlled by a digital control signal with nominal digital voltage levels (e.g., 0V and Vpos).

FIG. 3 shows an exemplary design of control circuit 338 to generate a control signal for a MOS transistor in a negative voltage generator. Control circuit 338 can generate the control signal having a negative voltage level without using a level shifter. Control circuit 338 may also be implemented in other manners with other circuit designs. Control circuit 338 is not coupled to the Vneg output of the negative voltage generator.

Figure 4:
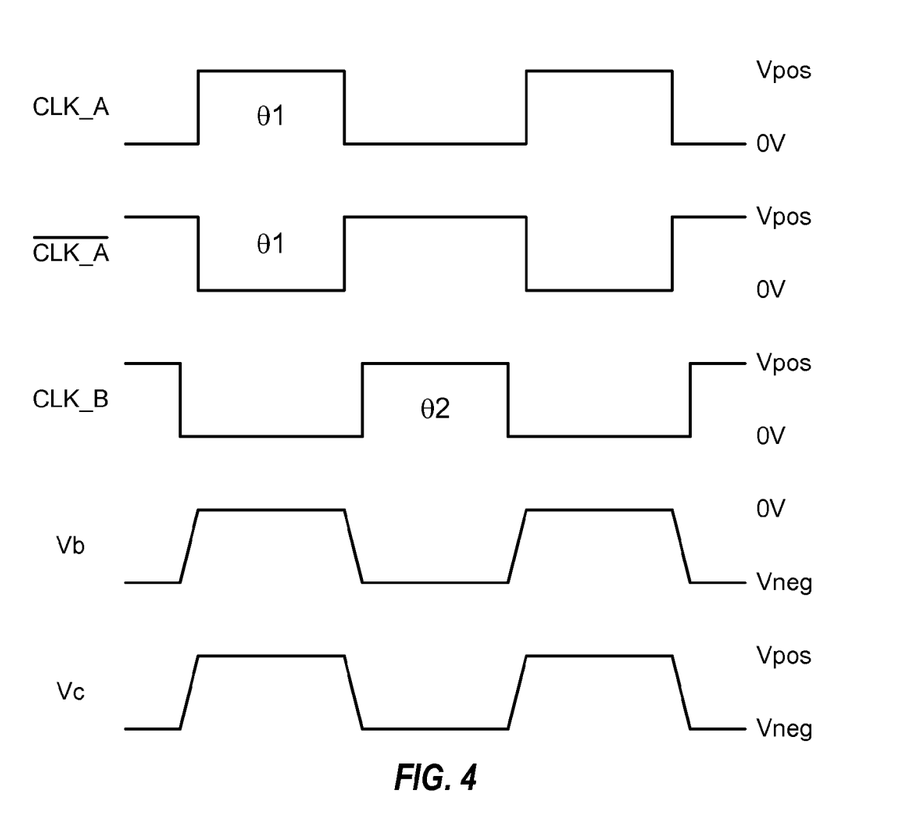
FIG. 4 shows control signals for the negative voltage generator in FIG. 3.

FIG. 4 shows a timing diagram of the control signals for negative voltage generator 300 in FIG. 3. The CLK_A signal is at logic high and the $\overline{CLK\_A}$ signal is at logic low during a first phase θ1 of a clock signal, and these control signals are at the opposite logic for the remaining time. The CLK_B signal is at logic high during a second phase θ2 of a clock signal and is at logic low for the remaining time. The first phase is non-overlapping with the second phase, as shown in FIG. 4. The CLK_A, $\overline{CLK\_A}$, and CLK_B signals are standard digital signals with a voltage level of Vpos for logic high and a voltage level of 0V for logic low.

FIG. 4 also shows the voltage at node B (which is referred to as the Vb signal) and the Vc signal from control circuit 338. The Vb signal is at 0V during the first phase when MOS transistors 322 and 326 are closed and is at Vneg during the second phase when MOS transistor 324 is closed. The Vc signal is at Vpos during the first phase when the CLK_A signal is at Vpos and the Vb voltage is at 0V. The Vc signal is at Vneg during the second phase when the CLK_A signal is at 0V and the Vb signal is at Vneg. The Vc signal thus swing between Vpos and Vneg but is generated without using the Vneg signal at the output of negative voltage generator 300. In particular, the Vneg voltage on the Vc signal is obtained from the voltage at node B instead of the Vneg output.

Referring back to FIG. 3, negative voltage generator 300 operates as follows. During the first phase, PMOS transistor 322 is turned on, NMOS transistor 324 is turned off, and the Vpos is applied to the top plate of capacitor 332. Within inverter 340, PMOS transistor 344 is turned on due to its gate being grounded and its drain being provided with Vpos by the logic high on the CLK_A signal. Inverter 340 thus provides a high voltage on the Vc signal, which turns on NMOS transistor 326 and grounds node B and the bottom plate of capacitor 332. NMOS transistor 342 is turned off due to its source being provided with 0V at node B and its gate being coupled to circuit ground. Since the Vb voltage is at ground, NMOS transistor 328 has its drain coupled to node B, its source coupled to the Vneg output of generator 300, and its gate coupled to its source. This results in NMOS transistor 328 being turned off, and capacitor 332 being isolated from capacitor 334 via NMOS transistor 328. Capacitor 332 is charged to Vpos by the Vpos voltage.

During the second phase, PMOS transistor 322 is turned off, NMOS transistor 324 is turned on, the top plate of capacitor 332 is grounded, and node B is at a negative voltage due to node A being grounded and capacitor 332 being flipped upside-down. Within inverter 340, NMOS transistor 342 is turned on due to is gate being grounded and its source being provided with the negative voltage at node B. PMOS transistor 344 is turned off due to its drain being provided with 0V by the logic low on the CLK_A signal. Inverter 340 thus provides a negative voltage on the Vc signal, which turns off NMOS transistor 326. Since the Vb voltage is at a negative voltage, NMOS transistor 328 has its source coupled to node B, its drain coupled to the Vneg output of generator 300, and its gate coupled to its drain. If Vb<Vneg, then NMOS transistor 328 is turned on, and capacitor 332 charges capacitor 334 via NMOS transistor 328.

In a second aspect of the invention, a combination of a boost circuit and a negative voltage generator may be used to generate a negative voltage having a larger magnitude than a positive voltage available for use. This may be desirable when a larger negative voltage is desired.

Figure 5:
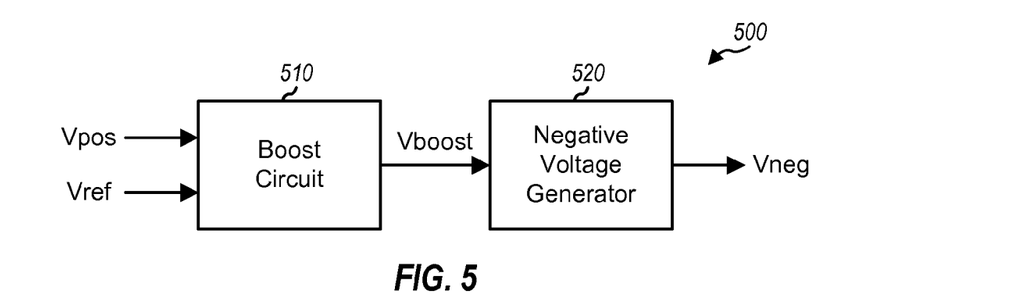
FIGS. 5 and 6 show a boost/negative voltage generator composed of a boost circuit and a negative voltage generator.

FIG. 5 shows a block diagram of an exemplary design of a boost/negative voltage generator 500 comprising a boost circuit 510 and a negative voltage generator 520. A boost/negative voltage generator may also be referred to as a negative voltage generator. Boost circuit 510 receives a positive voltage (Vpos) and a reference voltage (Vref) and generates a boosted voltage (Vboost) that is approximately equal to Vpos+Vref. Negative voltage generator 520 receives the boosted voltage and generates a negative voltage (Vneg) that is approximately equal to −(Vpos+Vref).

Boost circuit 510 and negative voltage generator 520 may be implemented in various manners. In an exemplary design, boost circuit 510 and negative voltage generator 520 may be implemented with switched-capacitor circuits operating based on standard digital control signals having nominal voltage levels (e.g., 0V and Vpos).

Figure 6:
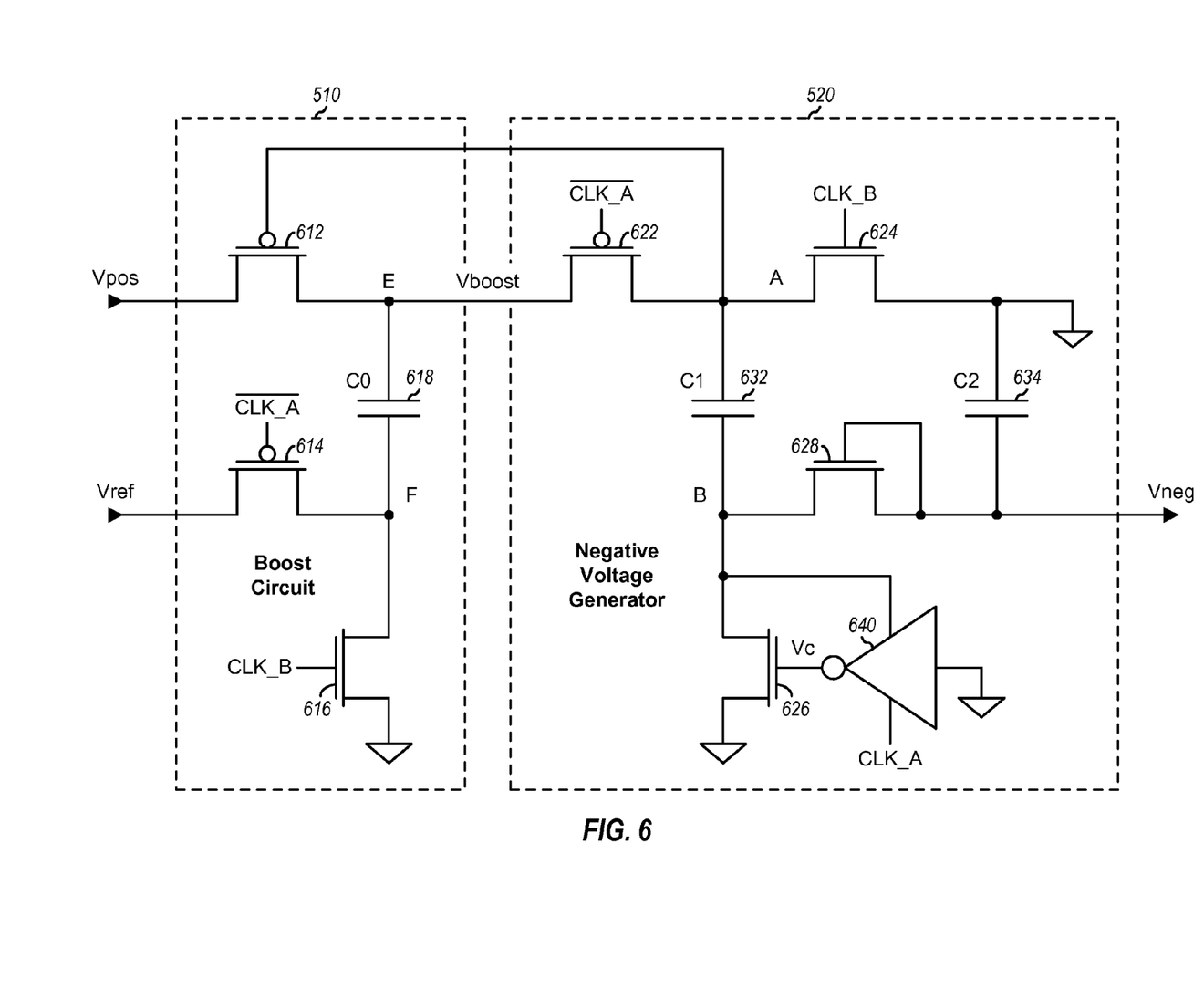

FIG. 6 shows a schematic diagram of an exemplary design of boost circuit 510 and negative voltage generator 520 within boost/negative voltage generator 500 in FIG. 5. Within boost circuit 510, a PMOS transistor 612 has one source/drain terminal coupled to a first input of boost circuit 510, the other source/drain terminal coupled to node E, and a gate coupled to node A within negative voltage generator 520. A PMOS transistor 614 has one source/drain terminal coupled to a second input of boost circuit 510, the other source/drain terminal coupled to node F, and a gate receiving a $\overline{CLK\_A}$ control signal. A capacitor 618 is coupled between node E and node F and has a capacitance of C0. An NMOS transistor 616 has its drain coupled to node F, its source coupled to circuit ground, and its gate receiving a CLK_B control signal.

A positive voltage (Vpos) is provided to the first input of boost circuit 510. A reference voltage (Vref) is provided to the second input of boost circuit 510. In one exemplary design, the Vref voltage may be as high as the Vpos voltage and may be derived from the Vpos voltage. The Vref voltage may be a fixed voltage. Alternatively, the Vref voltage may be an adjustable voltage (e.g., a programmable voltage) that may be set based on the desired Vneg voltage.

In the exemplary design shown in FIG. 6, negative voltage generator 520 includes a PMOS transistor 622, NMOS transistors 624, 626 and 628, capacitors 632 and 634, and an inverter 640, which are coupled in similar manner as PMOS transistor 322, NMOS transistors 324, 326 and 328, capacitors 332 and 334, and inverter 340 in FIG. 3.

FIG. 4 shows a timing diagram of the control signals for boost circuit 510 and negative voltage generator 520 in FIG.

6. The CLK_A signal is at logic high and the $\overline{\text{CLK\_A}}$ signal is at logic low during a first phase θ1 of a clock signal. The CLK_B signal is at logic high during a second phase θ2 of a clock signal. The CLK_A, $\overline{\text{CLK\_A}}$, and CLK_B signals are standard digital signals with a voltage level of Vpos for logic high and a voltage level of 0V for logic low.

Boost circuit 510 and negative voltage generator 520 operate as follows. During the second phase, capacitor 618 is charged by the Vpos voltage, and capacitor 632 charges capacitor 634 to the Vneg voltage. During the first phase, capacitor 618 is boosted by the Vref voltage and charges capacitor 632, and capacitor 634 provides the Vneg voltage.

During the second phase, within boost circuit 510, PMOS transistor 612 is turned on by 0V at node A, PMOS transistor 614 is turned off, and NMOS transistor 616 is turned on. Capacitor 618 has its bottom plate coupled to circuit ground and is charged by the Vpos voltage via PMOS transistor 612. Within negative voltage generator 520, PMOS transistor 622 is turned off, NMOS transistor 624 is turned on, NMOS transistor 626 is turned off, and NMOS transistor 628 is turned on, as described above for FIG. 3. Capacitor 632 has its top plate coupled to circuit ground and is flipped upside down. Capacitor 632 charges capacitor 634.

During the first phase, within boost circuit 510, PMOS transistor 612 is turned off by having its gate shorted to its source via PMOS transistor 622. PMOS transistor 614 is turned on, and NMOS transistor 616 is turned off. Capacitor 618 has its bottom plate coupled to the Vref voltage via PMOS transistor 614 and its top plate having a voltage of approximately Vpos+Vref. Capacitor 618 provides its charge to negative voltage generator 520. Within negative voltage generator 520, PMOS transistor 622 is turned on, NMOS transistor 624 is turned off, NMOS transistor 626 is turned on, and NMOS transistor 628 is turned off, as described above for FIG. 3. Capacitor 632 has its bottom plate coupled to circuit ground and is charged to approximately Vpos+Vref by capacitor 618. At the next second phase, capacitor 632 is flipped upside down, has a voltage of approximately −(Vpos+Vref), and charges capacitor 634 to this voltage. In steady state, the Vneg voltage is approximately equal to −(Vpos+Vref−Vth), where Vth is the threshold voltage of NMOS transistor 628.

The negative voltage generator described herein may have various advantages. First, the negative voltage generator can operate based on standard digital control signals, which may be generated without using level shifters. This may avoid the disadvantages of using level shifters described above. This may also avoid the need to use AC coupling capacitors for NMOS transistors coupled to node B (e.g., MOS transistors 326 and 328 in FIG. 3), which may result in a smaller circuit area. Second, a control signal is not needed for NMOS transistors at the output of the negative voltage generator (e.g., NMOS transistors 328 and 628 in FIGS. 3 and 6). This may reduce spurs from the control signal coupling on the negative voltage supply.

A boost/negative voltage generator comprising a boost circuit and a negative voltage generator described herein may have various advantages. First, the boost/negative voltage generator can provide a negative voltage having a magnitude that is larger than the magnitude of the positive voltage. For example, the Vneg voltage may be almost twice the magnitude of the Vpos voltage, e.g., with Vpos=1.8V and Vneg≈−3.4V. Second, the negative voltage may be programmable by simply adjusting the Vref voltage. Third, the boost and invert functions may be efficiently performed using two phases of a clock signal, as described above, which may simplify implementation and operation of the boost/negative voltage generator.

The negative voltage generators described herein may be used for various electronics devices such as wireless communication devices (e.g., cellular phones, smartphones, etc.) tablets, personal digital assistants (PDAs), handheld devices, wireless modems, laptop computers, smartbooks, netbooks, cordless phones, wireless local loop (WLL) stations, Bluetooth devices, consumer electronic devices, etc. The use of the negative voltage generators in a wireless communication device is described below.

Figure 7:
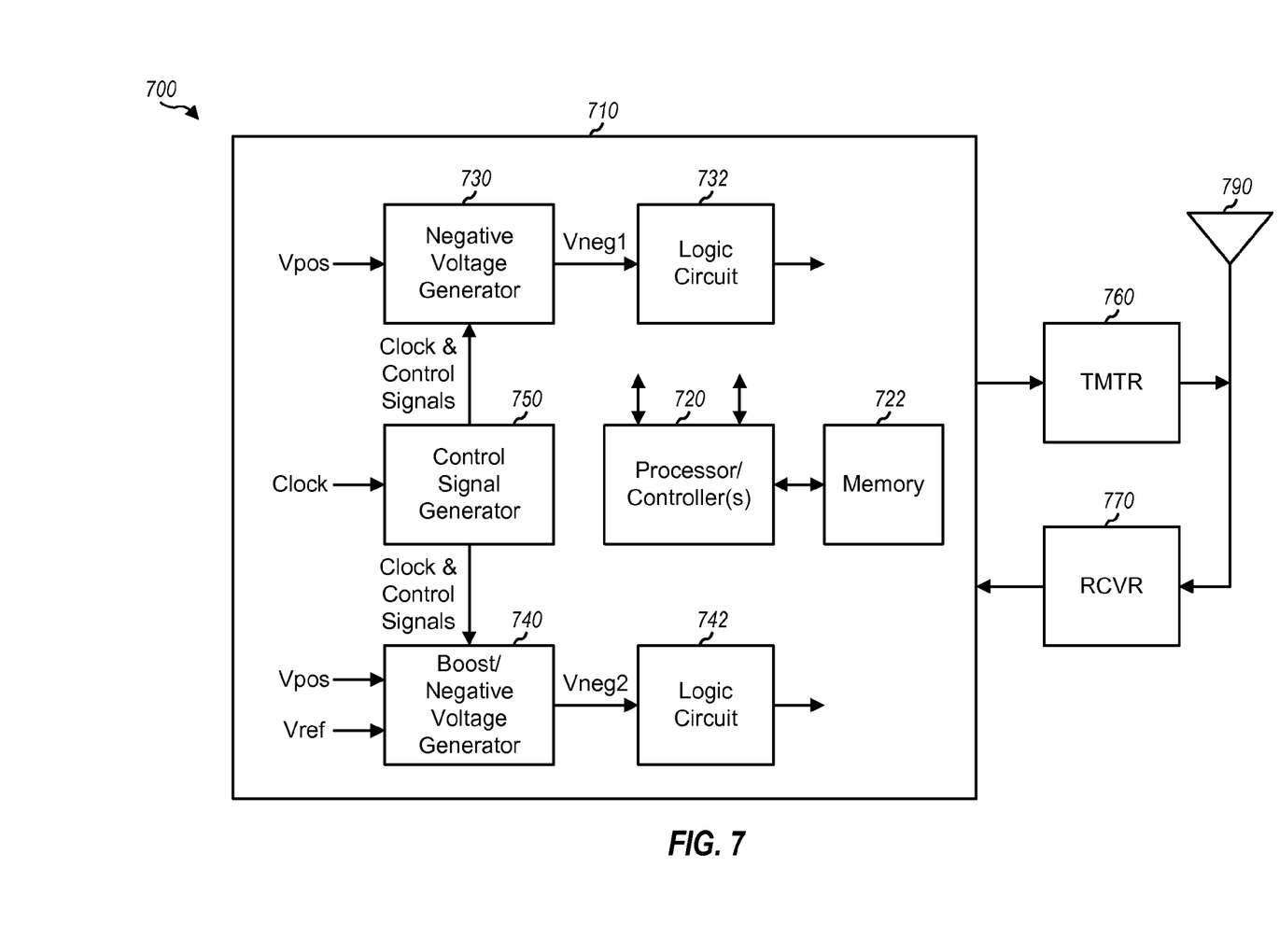
FIG. 7 shows a block diagram of a wireless communication device.

FIG. 7 shows a block diagram of an exemplary design of a wireless communication device 700. In this exemplary design, wireless device 700 includes an integrated circuit 710, a transmitter (TMTR) 760, and a receiver (RCVR) 770 that support bi-directional wireless communication. Integrated circuit 710 may be an application specific integrated circuit (ASIC) or some other type of IC.

Within integrated circuit 710, a negative voltage generator 730 receives a positive voltage (Vpos) and generates a first negative voltage (Vneg1). Generator 730 may be implemented with negative voltage generator 300 in FIG. 3 or some other negative voltage generator that does not utilize level shifters. A boost/negative voltage generator 740 receives the positive voltage and a reference voltage (Vref) and generates a second negative voltage (Vneg2). Generator 740 may be implemented with boost/negative voltage generator 500 in FIGS. 5 and 6 or some other boost/negative voltage generator. A control signal generator 750 receives a clock and generates clock and/or control signals for negative voltage generators 730 and 740. A logic circuit 732 receives the Vneg1 voltage from generator 730 and may use the Vneg1 voltage as a lower power supply voltage for its circuits. A logic circuit 742 receives the Vneg2 voltage from generator 740 and may use the Vneg2 voltage as a lower power supply voltage for its circuits. Logic circuits 732 and 742 may perform various functions such as turning off switches.

Processor/controller(s) 720 may perform various functions for wireless device 700, e.g., processing for data being transmitted and/or data being received. A memory 722 may store program codes and data for processor/controller(s) 720. Integrated circuit 710 may also include other modules, processors, memories, etc.

Transmitter 760 receives an analog output signal from integrated circuit 710 and processes (e.g., amplifies, filters, and upconverts) the analog output signal to generate an output radio frequency (RF) signal, which is transmitted via an antenna 790. Receiver 770 receives an input RF signal from antenna 790 and processes (amplifies, filters, and downconverts) the input RF signal and provides an analog input signal to integrated circuit 710. Transmitter 760 and/or receiver 770 may include (i) a negative voltage generator and/or a boost/negative voltage generator, or (ii) receive the Vneg1 voltage from negative voltage generator 730, and/or (iii) receive the Vneg2 voltage from boost/negative voltage generator 740. The Vneg1 and/or Vneg2 voltage may be used to turn off switches, to provide power to circuits, etc.

As shown in FIG. 7, a compact negative voltage generator 730 and/or boost/negative voltage generator 740 may generate negative voltages, which may be used as negative supply voltages for logic circuits 732 and/or 742. A small amount of integrated capacitance may be available on integrated circuit 710. Negative voltage generators 730 and/or 740 may be controlled as described above and may avoid using level shifters. This may allow negative voltage generators 730 and 740 to avoid the disadvantages associated with the use of the level shifters including (i) lower efficiency due to the use of some charge from the negative voltage to power the level shifters, (ii) spurs in the negative voltage due to transitions in the level shifters, (iii) limited operating speed of the generators due to the speed of the level shifters, etc.

Figure 8:
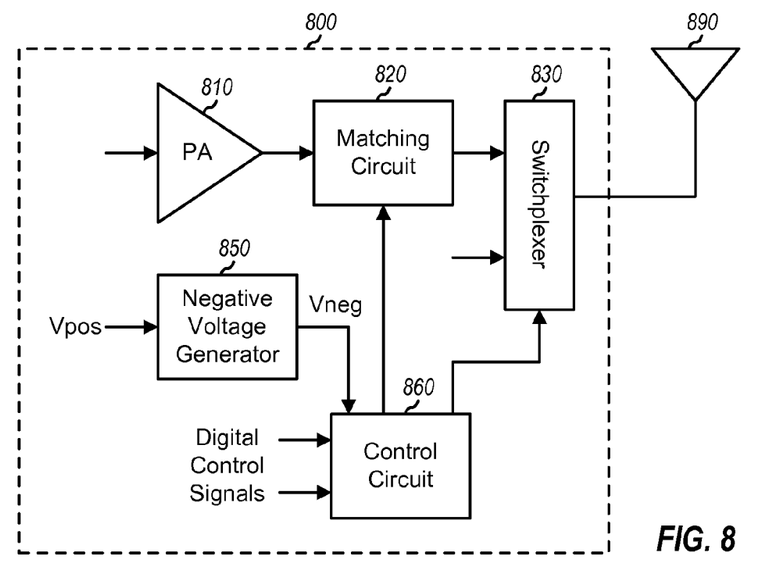
FIG. 8 shows a block diagram of a transmitter.

FIG. 8 shows a block diagram of an exemplary design of a transmitter 800, which may be used for transmitter 760 in FIG. 7. Within transmitter 800, a power amplifier (PA) 810 receives and amplifies a modulated signal and provides an amplified RF signal having the proper output power level. A matching circuit 820 is coupled to the output of PA 810 and performs impedance and/or power matching for PA 810. Matching circuit 820 may be a programmable matching circuit having one or more circuit components (e.g., capacitors) that can be varied or switched to obtain the desired matching for PA 810. A switchplexer 830 may include a number of switches. Switchplexer 830 may have one input coupled to the output of matching circuit 820, other inputs coupled to other filters and/or matching circuits, and an output coupled to an antenna 890. Transmitter 800 may also include other circuits, such as mixers, filters, amplifiers, etc., which are not shown in FIG. 8 for simplicity.

A negative voltage generator 850 receives a positive voltage (Vpos) and possibly a reference voltage (Vref) and generates a negative voltage (Vneg). Negative voltage generator 850 may be implemented with negative voltage generator 300 in FIG. 3, boost/negative voltage generator 500 in FIGS. 5 and 6, or some other negative voltage generator. A control circuit 860 receives the Vpos voltage, the Vneg voltage, and digital control signals. Control circuit 860 generates control signals having negative voltage level for matching circuit 820 and switchplexer 830. The Vneg voltage may also be used for other circuits within transmitter 800.

Figure 9:
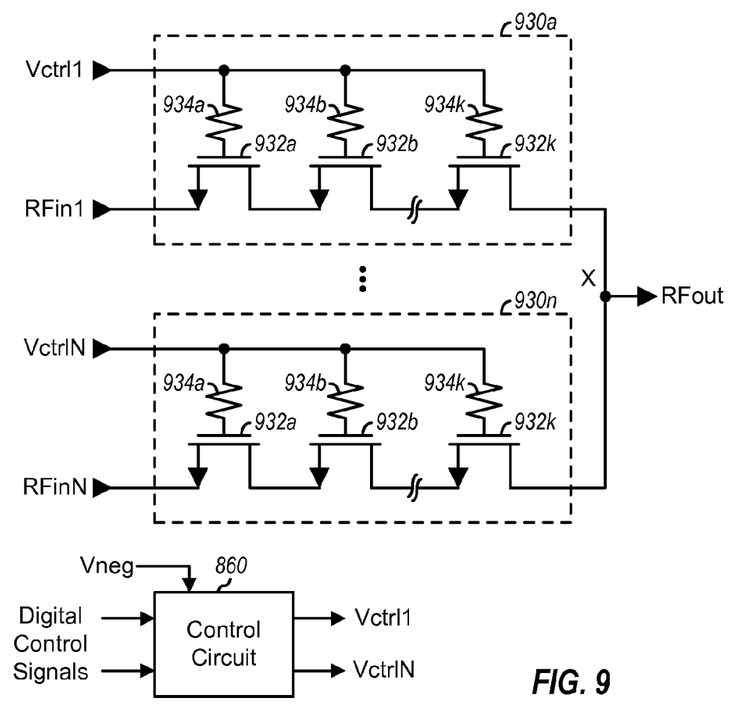
FIG. 9 shows a schematic diagram of multiple switches.

FIG. 9 shows a schematic diagram of N RF switches 930a to 930n implemented with stacked NMOS transistors, where N≥1. RF switch 930a includes K NMOS transistors 932a to 932k coupled in a stacked configuration (or in series), where K may be any integer value greater than one. K may be different for different RF switches. The leftmost NMOS transistor 932a has one source/drain terminal receiving a first input RF signal (RFin1), and the rightmost NMOS transistor 932k has one source/drain terminal providing an output RF signal (RFout). RF switch 930a further includes K resistors 934a to 934k having one end coupled together and the other end coupled to the gates of NMOS transistors 932a to 932k, respectively. Each remaining RF switch 930 may be implemented in similar manner as RF switch 930a.

FIG. 9 shows an exemplary design in which the outputs of all N RF switches 930a to 930n are coupled together at node X. RF switches 930a to 930n may be used for switchplexer 830 in FIG. 8. RF switches 930a to 930n may also be used individually instead of being coupled to one another.

Control circuit 860 generates control signals Vctrl1 to VctrlN for the N RF switches 930a to 930n based on digital control signals, the Vneg voltage, and possibly the Vpos voltage. Each Vctrl control signal may have a voltage level of Vneg to fully turn off NMOS transistors 932 within a corresponding RF switch 930.

In an exemplary design, an apparatus (e.g., a wireless device, an IC, a circuit module, etc.) may include a switch and a control circuit for a negative voltage generator. The negative voltage generator may receive a positive voltage and provide a negative voltage. The switch (e.g., NMOS transistor 326 in FIG. 3) may be coupled between an internal node (e.g., node B) of the negative voltage generator and circuit ground. The internal node may have a negative voltage level during a portion of each switching interval (e.g., during clock phase θ2 in FIG. 4). The control circuit (e.g., control circuit 338) may generate a control signal (e.g., the Vc control signal) for the switch using the negative voltage level at the internal node.

In an exemplary design, the control circuit may comprise an inverter (e.g., inverter 340 in FIG. 3) that receives a digital control signal (e.g., the CLK_A signal) having non-negative voltage levels and provides the control signal having positive and negative voltage levels for the switch. The inverter may have an input coupled to circuit ground, an upper supply pin receiving the digital control signal, a lower supply pin coupled to the internal node, and an output coupled to the switch, e.g., as shown in FIG. 3. The control circuit may also be implemented in other manners.

In an exemplary design, the negative voltage generator may further include second, third, and fourth switches and a capacitor. The second switch (e.g., PMOS transistor 322 in FIG. 3) may be coupled between an input node and a second internal node (e.g., node A) of the negative voltage generator. The third switch (e.g., NMOS transistor 324) may be coupled between the second internal node and circuit ground. The fourth switch (e.g., NMOS transistor 328) may be coupled between the internal node and an output node of the negative voltage generator. The input node may receive the positive voltage, and the output node may provide the negative voltage. The capacitor (e.g., capacitor 332) may be coupled between the internal node and the second internal node.

The second and third switches may receive second and third control signals (e.g., the $\overline{\text{CLK\_A}}$ and CLK_B signals) having non-negative voltage levels. The control circuit may receive a fourth control signal (e.g., the CLK_A signal) having non-negative voltage levels and may provide the control signal (e.g., the Vc control signal) having positive and negative voltage levels for the switch, e.g., as shown in FIG. 4.

In an exemplary design, the second switch may comprise a PMOS transistor. The switch, the third switch, and the fourth switch may comprise first, second, and third NMOS transistors, respectively. The third NMOS transistor (e.g., NMOS transistor 328) for the fourth switch may be diode connected and may have a first source/drain terminal coupled to the internal node, a second source/drain terminal coupled to the output node, and a gate coupled to the output node.

The negative voltage from the negative voltage generator may be used in various manners. For example, the negative voltage may be used for circuits in a wireless device (e.g., as shown in FIG. 7), for circuits in a transmitter (e.g., as shown in FIG. 8), etc. In an exemplary design, the negative voltage may be used to generate control signals for RF switches (e.g., as shown in FIG. 9). An RF switch may comprise at least one MOS transistor configured to receive a control signal generated based on the negative voltage and having a negative voltage level.

In another exemplary design, an apparatus (e.g., a wireless device, an IC, a circuit module, etc.) may include a boost circuit and a negative voltage generator. The boost circuit (e.g., boost circuit 510 in FIGS. 5 and 6) may receive a positive voltage and a reference voltage and provide a boosted voltage. The negative voltage generator (e.g., negative voltage generator 520) may be coupled to the boost circuit and may receive the boosted voltage and provide a negative voltage.

In an exemplary design, the boost circuit may comprise first, second, and third switches and a capacitor. The first switch (e.g., PMOS transistor 612 in FIG. 6) may be coupled between a first input and an output of the boost circuit. The second switch (e.g., PMOS transistor 614) may be coupled between a second input of the boost circuit and a first node (e.g., node F). The third switch (e.g., NMOS transistor 616)

may be coupled between the first node and circuit ground. The capacitor (e.g., capacitor 618) may be coupled between the output of the boost circuit and the first node. The first, second, and third switches may comprise MOS transistors, e.g., as shown in FIG. 6.

In an exemplary design, the negative voltage generator may comprise first, second, third, and fourth switches, a capacitor, and a control circuit. The first switch (e.g., PMOS transistor 622 in FIG. 6) may be coupled between an input of the negative voltage generator and a first node (e.g., node A). The second switch (e.g., NMOS transistor 624) may be coupled between the first node and circuit ground. The third switch (e.g., NMOS transistor 626) may be coupled between a second node (e.g., node B) and circuit ground. The fourth switch (e.g., NMOS transistor 628) may be coupled between the second node and an output of the negative voltage generator. The input of the negative voltage generator may receive the boosted voltage, and the output of the negative voltage generator may provide the negative voltage. The capacitor (e.g., capacitor 632) may be coupled between the first node and the second node. The control circuit (e.g., inverter 640) may generate a control signal for the third switch using a negative voltage level at the second node. The control signal may have positive and negative voltage levels. The first switch (e.g., PMOS transistor 612) in the boost circuit may be controlled by a voltage at the first node (e.g., node A) of the negative voltage generator, e.g., as shown in FIG. 6.

In an exemplary design, the boost circuit and the negative voltage generator may perform voltage boost and inversion functions in two phases of a clock signal. The boost circuit may comprise a first capacitor (e.g., capacitor 618) that may be charged by the positive voltage during a first clock phase and may provide its stored charge during a second clock phase. The negative voltage generator may comprise a second capacitor (e.g., capacitor 632) that may be charged by the first capacitor during the second clock phase and may provide its stored charge during the first clock phase. The negative voltage generator may further comprise a third capacitor (e.g., capacitor 634) that be charged by the second capacitor during the first clock phase and may provide its stored charge during the second clock phase.

In an exemplary design, the positive voltage may be a fixed voltage, and the reference voltage may be a fixed voltage or an adjustable voltage (e.g., a programmable voltage). The negative voltage may be a fixed voltage if the reference voltage is a fixed voltage and may be an adjustable voltage if the reference voltage is an adjustable voltage.

Figure 10:
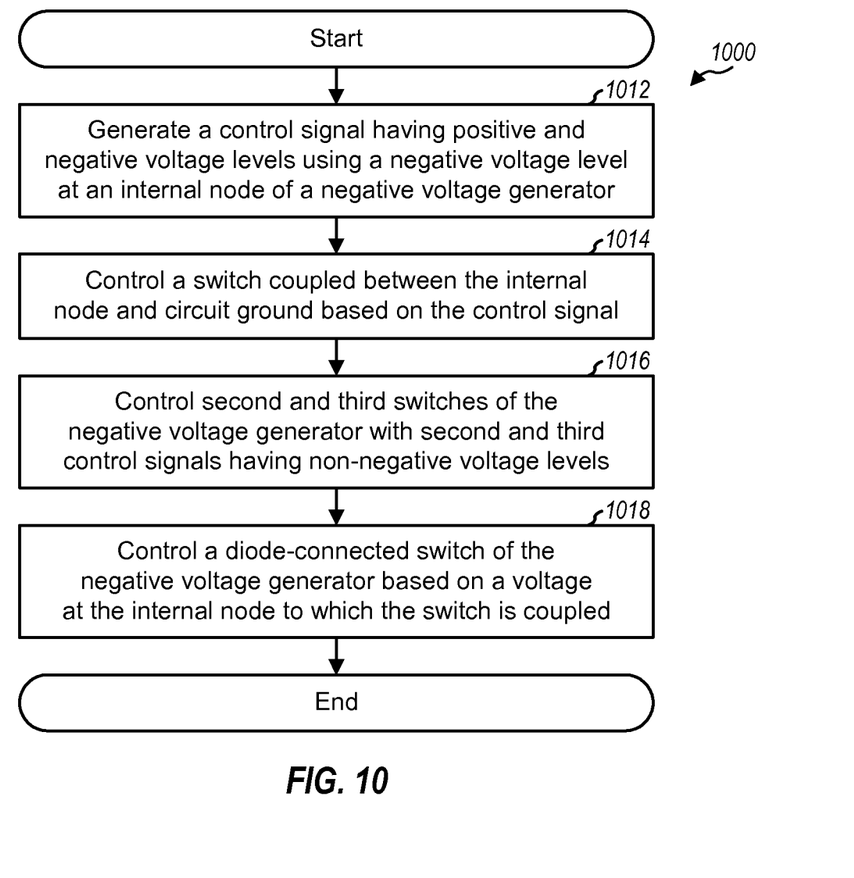
FIG. 10 shows a process for generating a negative voltage.

FIG. 10 shows an exemplary design of a process 1000 for generating a negative voltage. A control signal (e.g., the Vc control signal in FIG. 3) having positive and negative voltage levels may be generated using a negative voltage level at an internal node (e.g., node B) of a negative voltage generator (block 1012). A switch (e.g., NMOS transistor 326) coupled between the internal node and circuit ground may be controlled based on the control signal (block 1014). The negative voltage generator may include second and third switches (e.g., MOS transistors 322 and 324), which may be controlled with second and third control signals (e.g., the $\overline{CLK\_A}$ and CLK_B signals) having non-negative voltage levels (block 1016). The negative voltage generator may further include a diode-connected switch (e.g., NMOS transistor 328), which may be controlled based on a voltage at the internal node to which the switch is coupled (block 1018).

In an exemplary design, the negative voltage generator may generate the negative voltage based on a positive voltage (e.g., as shown in FIG. 3). In another exemplary design, a boosted voltage may be generated (e.g., by boost circuit 510 in FIG. 6) based on a positive voltage and a reference voltage.

The negative voltage generator may then generate the negative voltage based on the boosted voltage (e.g., as shown in FIG. 6).

The negative voltage generators described herein may be implemented on an IC, an analog IC, a radio frequency IC (RFIC), a mixed-signal IC, an application specific integrated circuit (ASIC), a printed circuit board (PCB), an electronic device, etc. The voltage generators may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the negative voltage generators described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a switch coupled between an internal node of a negative voltage generator and circuit ground, the internal node switchably isolated from an output of the negative voltage generator and having a negative voltage level during a portion of each switching interval; and
   a control circuit continuously coupled to the internal node and configured to generate a control signal for the switch using the negative voltage level at the internal node, wherein clock signals causing the switching interval have levels between a positive voltage and a reference voltage, the reference voltage having a level capable of boosting the positive voltage.

2. The apparatus of claim 1, the control circuit comprising: an inverter configured to receive a digital control signal having non-negative voltage levels and to provide the control signal having positive and negative voltage levels for the switch.

3. The apparatus of claim 2, the inverter having an input coupled to circuit ground, an upper supply pin receiving the digital control signal, a lower supply pin coupled to the internal node, and an output coupled to the switch.

4. The apparatus of claim 1, further comprising:
   a second switch coupled between an input node and a second internal node of the negative voltage generator, the input node receiving the positive voltage;
   a third switch coupled between the second internal node and circuit ground;
   a fourth switch coupled between the internal node and an output node of the negative voltage generator, the output node providing a negative voltage; and
   a capacitor coupled between the internal node and the second internal node.

5. The apparatus of claim 4, the second and third switches receiving second and third control signals having non-negative voltage levels, and the control circuit receiving a fourth control signal having non-negative voltage levels and providing the control signal having positive and negative voltage levels for the switch.

6. The apparatus of claim 4, the second switch comprising a P-channel metal oxide semiconductor (PMOS) transistor, and the switch, the third switch, and the fourth switch comprising first, second, and third N-channel metal oxide semiconductor (NMOS) transistors, respectively.

7. The apparatus of claim 6, the third NMOS transistor for the fourth switch being diode connected and having a first source/drain terminal coupled to the internal node, a second source/drain terminal coupled to the output node, and a gate coupled to the output node.

8. The apparatus of claim 1, further comprising:
   a radio frequency (RF) switch comprising at least one metal oxide semiconductor (MOS) transistor configured to receive a second control signal generated based on a negative voltage from the negative voltage generator.

9. An apparatus comprising:
   a boost circuit configured to receive a positive voltage and a reference voltage and provide a boosted voltage; and
   a negative voltage generator coupled to the boost circuit and configured to receive the boosted voltage and provide a negative voltage, the negative voltage generator using a negative voltage generated internal to the negative voltage generator for switching within the negative voltage generator, the internally generated negative voltage switchably isolated from an output of the negative voltage generator, wherein clock signals for the boost circuit and negative voltage generator have levels between the positive voltage and a circuit ground, the reference voltage having a level capable of boosting the positive voltage.

10. The apparatus of claim 9, the boost circuit comprising:
    a first switch coupled between a first input and an output of the boost circuit;
    a second switch coupled between a second input of the boost circuit and a first node;
    a third switch coupled between the first node and circuit ground; and
    a capacitor coupled between the output of the boost circuit and the first node.

11. The apparatus of claim 9, the negative voltage generator comprising:
    a first switch coupled between an input of the negative voltage generator and a first node, the input receiving the boosted voltage;
    a second switch coupled between the first node and circuit ground;
    a third switch coupled between a second node and circuit ground;
    a fourth switch coupled between the second node and an output of the negative voltage generator, the output providing the negative voltage; and
    a capacitor coupled between the first node and the second node.

12. The apparatus of claim 11, the negative voltage generator further comprising:
    a control circuit configured to generate a control signal for the third switch using a negative voltage level at the second node, the control signal having positive and negative voltage levels.

13. The apparatus of claim 11, the boost circuit comprising:
    a fifth switch coupled between an input and an output of the boost circuit, the fifth switch being controlled by a voltage at the first node of the negative voltage generator.

14. The apparatus of claim 9, the boost circuit comprising a first capacitor being charged by the positive voltage during a first clock phase and providing stored charge on the first capacitor during a second clock phase, and the negative voltage generator comprising a second capacitor being charged by the first capacitor during the second clock phase and providing stored charge on the second capacitor during the first clock phase.

15. The apparatus of claim 14, the negative voltage generator further comprising a third capacitor being charged by the second capacitor during the first clock phase and providing stored charge on the third capacitor during the second clock phase.

16. The apparatus of claim 9, the reference voltage being an adjustable voltage, or being generated based on the positive voltage, or both.

17. A method comprising:
    generating a control signal having positive and negative voltage levels using a negative voltage level at an internal node of a negative voltage generator, the internal node switchably isolated from an output of the negative voltage generator and having a negative voltage level during a portion of each switching interval; and
    controlling a switch with a control circuit continuously coupled to the internal node, the switch coupled between the internal node and circuit ground based on the control signal, wherein clock signals causing the switching interval have levels between a positive voltage and a reference voltage, the reference voltage having a level capable of boosting the positive voltage.

18. The method of claim 17, further comprising:
generating a boosted voltage based on the positive voltage and the reference voltage; and
generating a negative voltage with the negative voltage generator based on the boosted voltage.

19. An apparatus comprising:
means for generating a negative voltage;
means for generating a control signal having positive and negative voltage levels using a negative voltage level at an internal node of the means for generating a negative voltage, the internal node switchably isolated from an output of the means for generating the negative voltage and having a negative voltage level during a portion of each switching interval, and the means for generating the control signal continuously coupled to the internal node; and
means for controlling a switch coupled between the internal node and circuit ground based on the control signal, wherein clock signals causing the switching interval have levels between a positive voltage and a reference voltage, the reference voltage having a level capable of boosting the positive voltage.

20. The apparatus of claim 19, further comprising:
means for generating a boosted voltage based on the positive voltage and the reference voltage, and the means for generating a negative voltage being configured to generate the negative voltage based on the boosted voltage.

* * * * *